United States Patent
Morales et al.

(10) Patent No.: US 10,821,907 B2
(45) Date of Patent: Nov. 3, 2020

(54) MONITOR ASSEMBLY FOR VEHICLE HEADREST

(71) Applicant: VOXX INTERNATIONAL CORPORATION, Hauppauge, NY (US)

(72) Inventors: Mike Morales, Orlando, FL (US); Jonathan Reiblich, Winter Springs, FL (US)

(73) Assignee: VOXX INTERNATIONAL CORPORATION, Hauppauge, NY (US)

( * ) Notice: Subject to any disclaimer, the term of this patent is extended or adjusted under 35 U.S.C. 154(b) by 0 days.

(21) Appl. No.: 16/540,317

(22) Filed: Aug. 14, 2019

(65) Prior Publication Data

US 2020/0055460 A1 Feb. 20, 2020

Related U.S. Application Data

(60) Provisional application No. 62/718,580, filed on Aug. 14, 2018.

(51) Int. Cl.
| | |
|---|---|
| *B60R 11/02* | (2006.01) |
| *H05K 7/20* | (2006.01) |
| *H05K 5/02* | (2006.01) |
| *H05K 5/00* | (2006.01) |
| *B60R 11/00* | (2006.01) |

(52) U.S. Cl.
CPC ........ *B60R 11/0235* (2013.01); *H05K 5/0017* (2013.01); *H05K 5/0213* (2013.01); *H05K 5/0278* (2013.01); *H05K 7/20963* (2013.01); *B60R 2011/0017* (2013.01)

(58) Field of Classification Search
CPC .................................................. B60R 11/0235
See application file for complete search history.

(56) References Cited

U.S. PATENT DOCUMENTS

| | | | |
|---|---|---|---|
| 7,762,627 B2* | 7/2010 | Chang | B60R 11/0235 297/217.3 |
| 2012/0280542 A1* | 11/2012 | Wood | B60N 2/879 297/180.1 |
| 2014/0060795 A1* | 3/2014 | Yu | B60H 1/00821 165/202 |
| 2016/0114736 A1* | 4/2016 | Tranchina | B60R 11/0235 348/837 |
| 2018/0084655 A1* | 3/2018 | Carswell | B60R 11/02 |

* cited by examiner

Primary Examiner — Mukundbhai G Patel
(74) Attorney, Agent, or Firm — Allen, Dyer, Doppelt, + Gilchrist, P.A. Attorneys at Law

(57) ABSTRACT

A monitor assembly for a vehicle headrest, the monitor assembly including: a monitor holding part, the monitor holding part including a first side and a second side opposite the first side, the first side configured to connect a monitor thereto, the second side configured to face a vehicle headrest, the monitor holding part further including: a digital media player disposed on the second side of the monitor holding part, the digital media player disposed on a heat sink; an input/output board disposed on the second side of the monitor holding part and connected to the digital media player; a vent extended lengthwise adjacent to an edge of the second side of the monitor holding part; and an opening adjacent to the heat sink, wherein the opening exposes the heat sink at the first side of the monitor holding part.

16 Claims, 8 Drawing Sheets

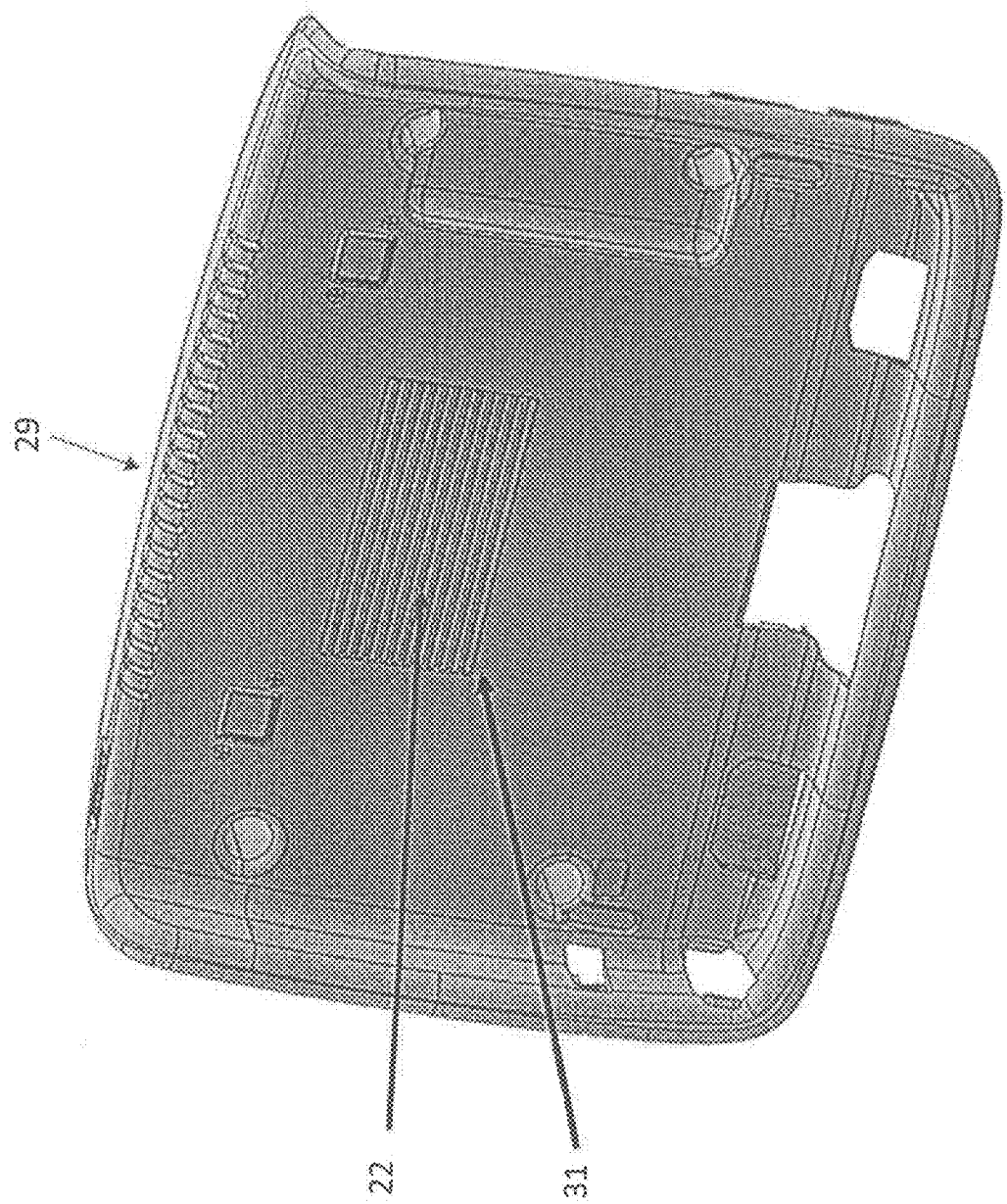

MONITOR ASSEMBLY FOR VEHICLE HEADREST

CROSS-REFERENCE TO RELATED APPLICATION

This application claims priority under 35 U.S.C. § 119/120 to U.S. provisional application No. 62/718,580, filed on Aug. 14, 2018 in the U.S. Patent and Trademark Office, the disclosure of which is incorporated by reference herein in its entirety.

TECHNICAL FIELD

The present invention relates to monitor assemblies, and more particularly to a monitor assembly for a vehicle headrest.

SUMMARY

According to an exemplary embodiment of the present invention, there is provided a monitor assembly for a vehicle headrest, comprising: a monitor holding part, the monitor holding part including a first side and a second side opposite the first side, the first side configured to connect a monitor thereto, the second side configured to face a vehicle headrest, the monitor holding part further including: a digital media player disposed on the second side of the monitor holding part, the digital media player disposed on a heat sink; an input/output board disposed on the second side of the monitor holding part and connected to the digital media player; a vent extended lengthwise adjacent to an edge of the second side of the monitor holding part; and an opening adjacent to the heat sink, wherein the opening exposes the heat sink at the first side of the monitor holding part.

The digital media player is an Amazon Fire TV stick or a Roku streaming stick.

The vent is exposed at the first side of the monitor holding part.

The second side of the monitor holding part includes a thermal pad between the digital media player and the heat sink.

The monitor assembly further comprises a clip for securing a first side of the digital media player, the first side of the digital media player being opposite a second side of the digital media player, the second side of the digital media player including a connector for mating with the input/output board.

The monitor further comprises an adaptor for securing a first side of the digital media player, the first side of the digital media player being opposite a second side of the digital media player, the second side of the digital media player including a connector for mating with the input/output board.

The digital media player is provided with power via the input/output board.

The monitor assembly is configured to be disposed in a recess at a rear side of a vehicle headrest.

The heat sink faces a back side of the monitor.

According to an exemplary embodiment of the present invention, there is provided a vehicle headrest display comprising: a monitor; and a base for pivotally securing the monitor, the base including a first side facing the monitor and a second side opposite the first side, a vent extended lengthwise along an upper portion of the first side and an upper portion of the second side, the vent including vent holes exposed at the first and second sides, the base further including a digital media player disposed on the second side, the digital media player being disposed on a heat sink, the heat sink being exposed at the first side.

The digital media player is an Amazon Fire TV stick or a Roku streaming stick.

The vehicle headrest display further comprises a means for securing the digital media player on the heat sink.

The vent is disposed adjacent to a top side of a vehicle headrest when the vehicle headrest display is mounted to the vehicle headrest.

According to an exemplary embodiment of the present invention, there is provided a monitor assembly for a vehicle headrest comprising: a housing including a first side and a second side opposite the first side, the first side configured to connect a monitor thereto, the second side configured to face a vehicle headrest, the housing further including: a digital media player disposed on the second side of the housing; a heat sink disposed in an opening formed in the second side of the housing; and a vent formed in a lip protruding from the second side of the housing.

The digital media player is an Amazon Fire TV stick or a Roku streaming stick.

The lip is substantially perpendicular to the second side of the housing.

The lip includes vents holes overlapping the digital media player in a direction parallel to a surface of the second side of the housing.

BRIEF DESCRIPTION OF THE DRAWINGS

FIG. 3A illustrates a first perspective view of a monitor facing side of a monitor assembly for a vehicle headrest according to an exemplary embodiment of the present invention;

Figure 1A:
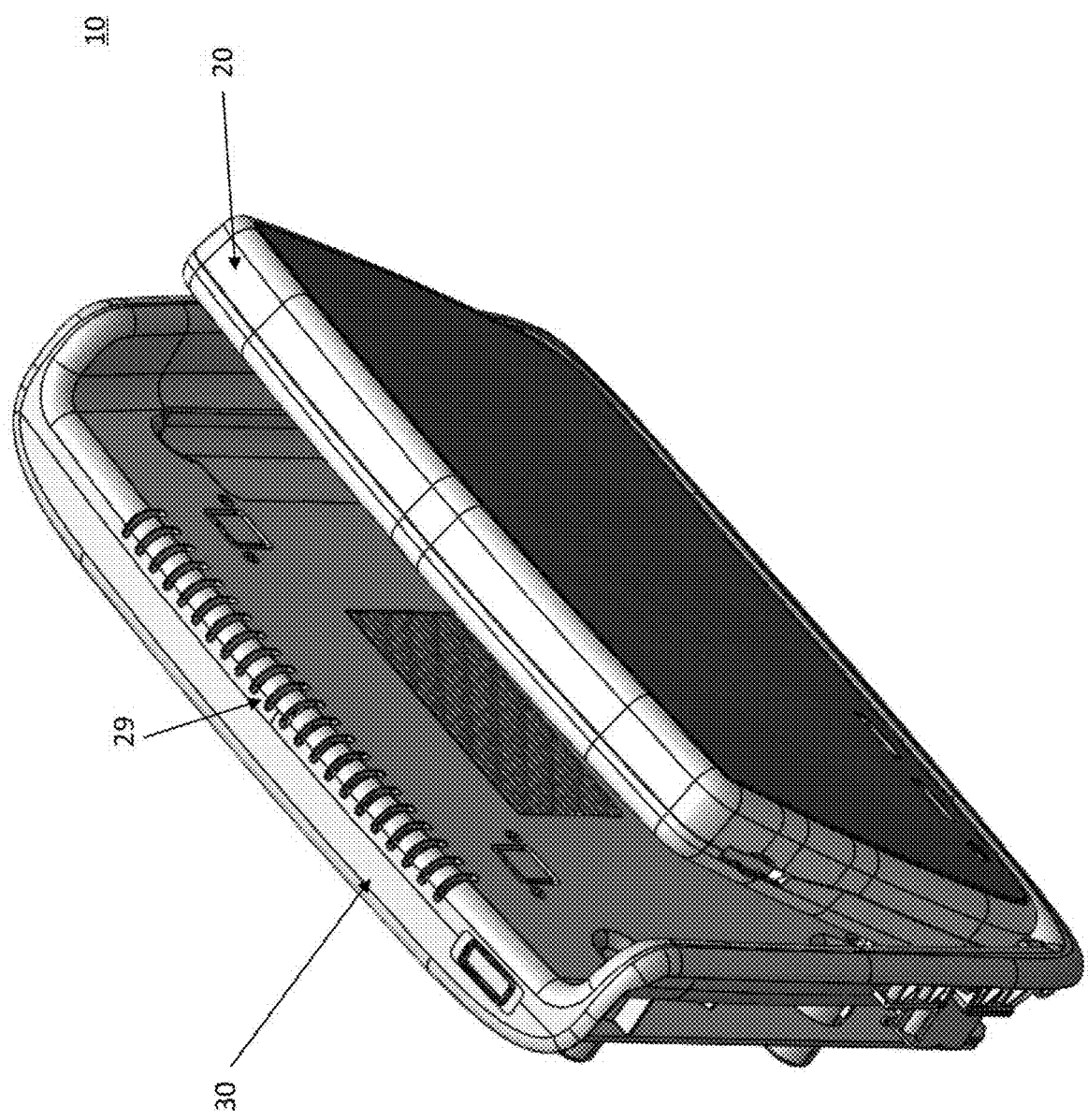
FIG. 1A illustrates a first perspective view of a monitor assembly for a vehicle headrest according to an exemplary embodiment of the present invention.

It is to be understood that the dimensions shown in the drawings are merely exemplary, and thus, the present invention is not limited thereto.

DETAILED DESCRIPTION OF EXEMPLARY EMBODIMENTS

In accordance with an exemplary embodiment of the present invention herein is disclosed a monitor assembly for a vehicle headrest. The monitor assembly may include a monitor (or display) pivotally mounted to a monitor holding part. The monitor assembly may be mated with a vehicle headrest. For example, the monitor assembly may be connected to the back side of a vehicle headrest so that passengers in the rear of a vehicle can view content displayed on the monitor. In particular, the vehicle passengers may view content streamed via an Amazon Fire TV stick or other digital media player on the monitor. Control of the content may be effectuated by the backseat passengers via a remote for the Amazon Fire TV stick.

Figure 1B:
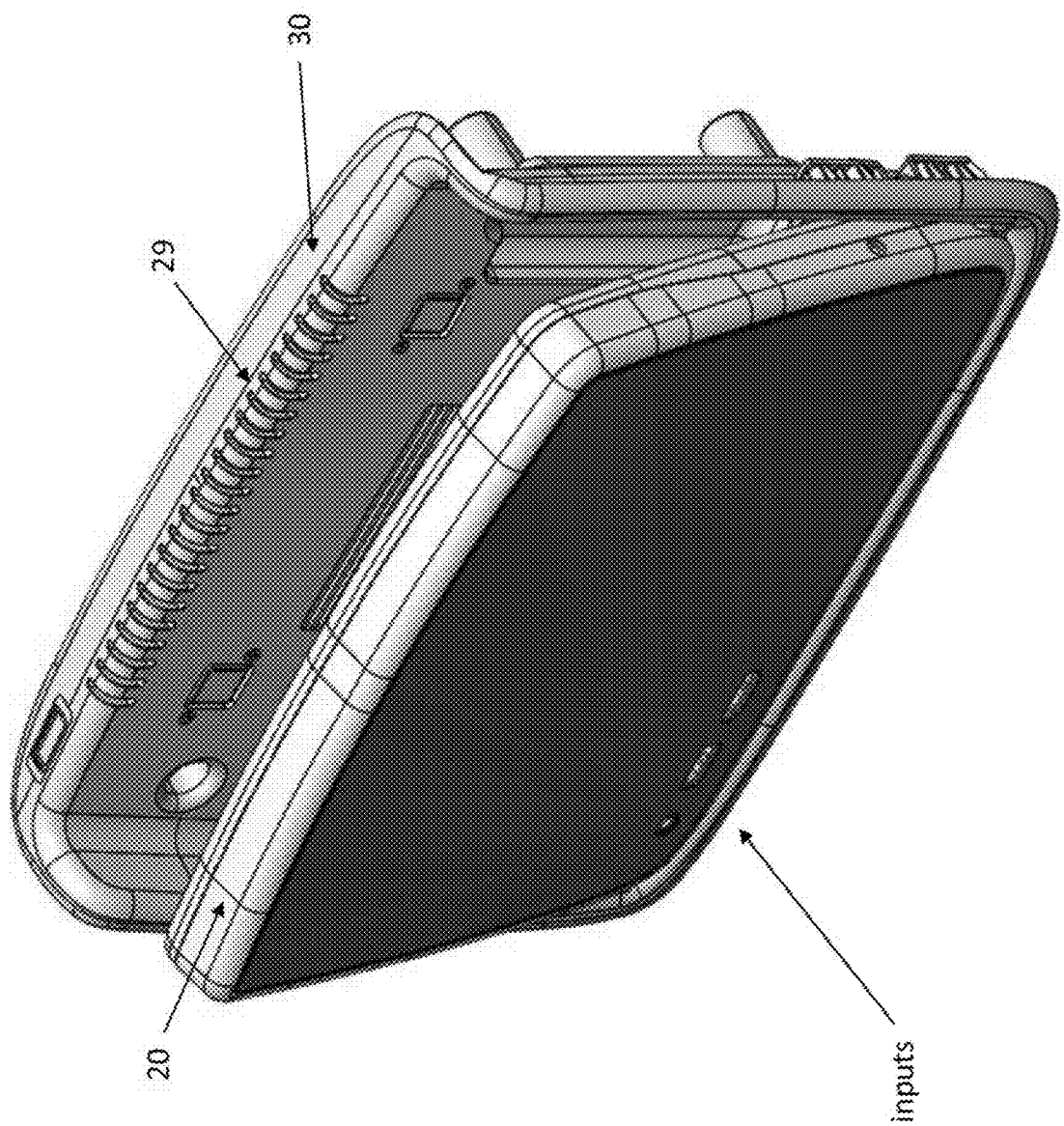
FIG. 1B illustrates a second perspective view of a monitor assembly for a vehicle headrest according to an exemplary embodiment of the present invention.

FIGS. 1A and 1B illustrate first and second perspective views of a monitor assembly for a vehicle headrest according to an exemplary embodiment of the present invention.

As shown in FIGS. 1A and 1B, monitor assembly 10 includes a monitor 20 and a monitor holding part 30. As can be seen, the monitor 20 is pivotally mounted to the monitor holding part 30. The monitor 20 may be a liquid crystal display (LCD) monitor; however, the present invention is not limited thereto and the monitor 20 can be any of a variety of types of monitors including an organic light emitting diode (OLED) display.

The monitor 20 may include electronic components that permit it to display content provided from a digital media player. For example, the monitor 20 may include a video driver for an LCD panel, a WiFi module, an infrared (IR) sensor for a remote control, a headphone input port, etc.

Figure 2A:
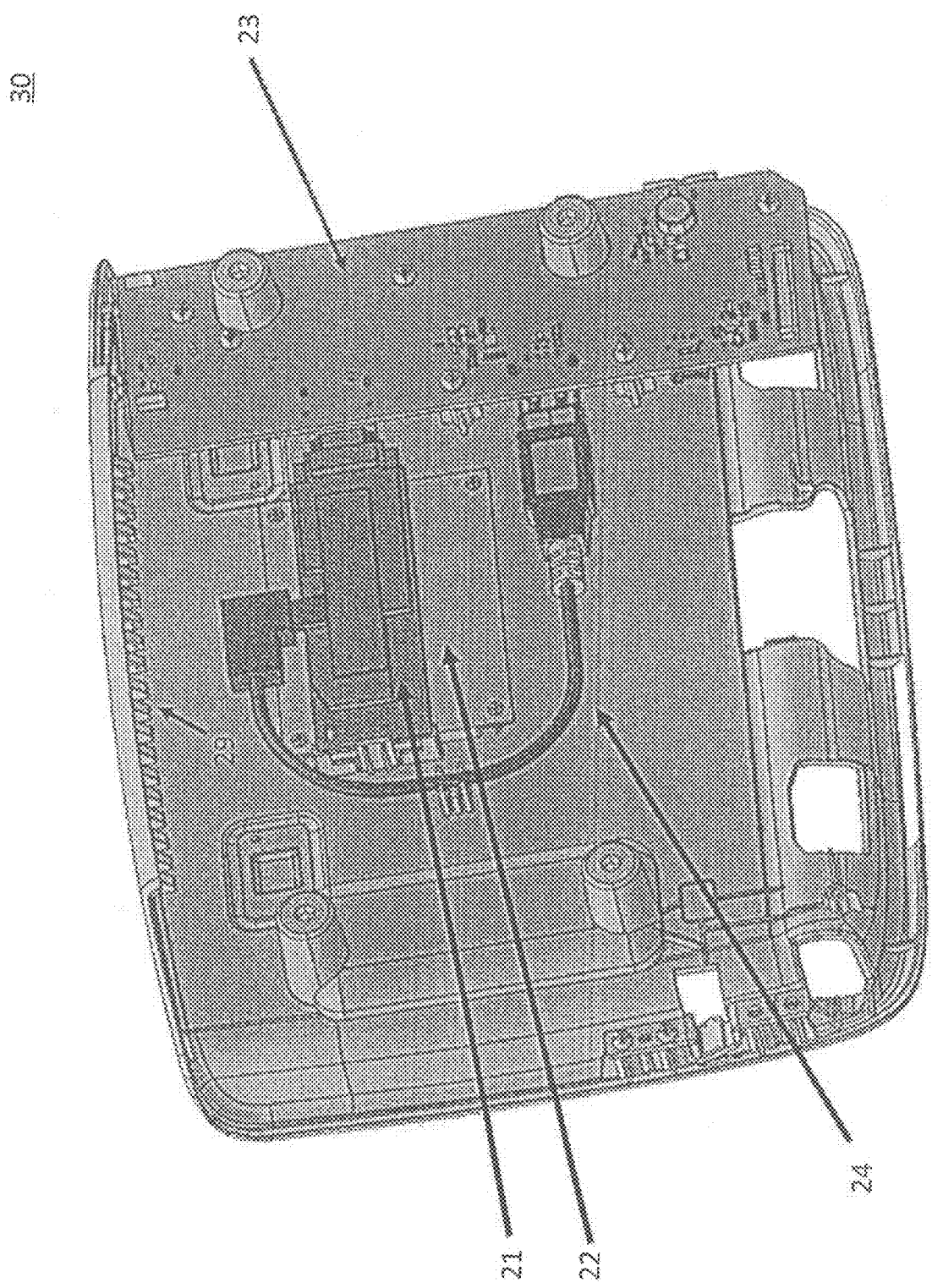
FIG. 2A illustrates a first perspective view of a back side of a monitor assembly for a vehicle headrest according to an exemplary embodiment of the present invention.
Figure 2B:
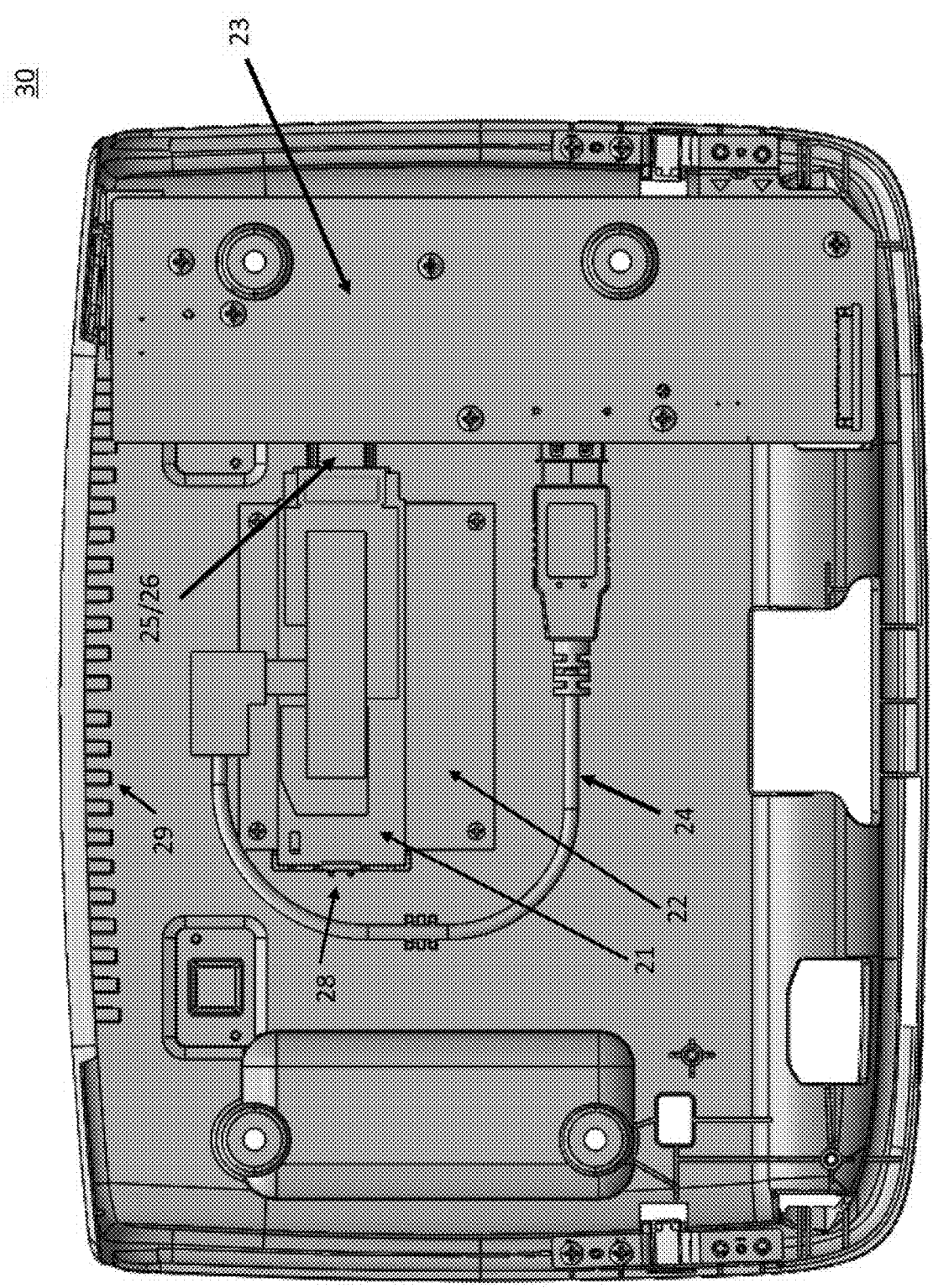
FIG. 2B illustrates a direct view of a back side of a monitor assembly for a vehicle headrest according to an exemplary embodiment of the present invention.
Figure 2C:
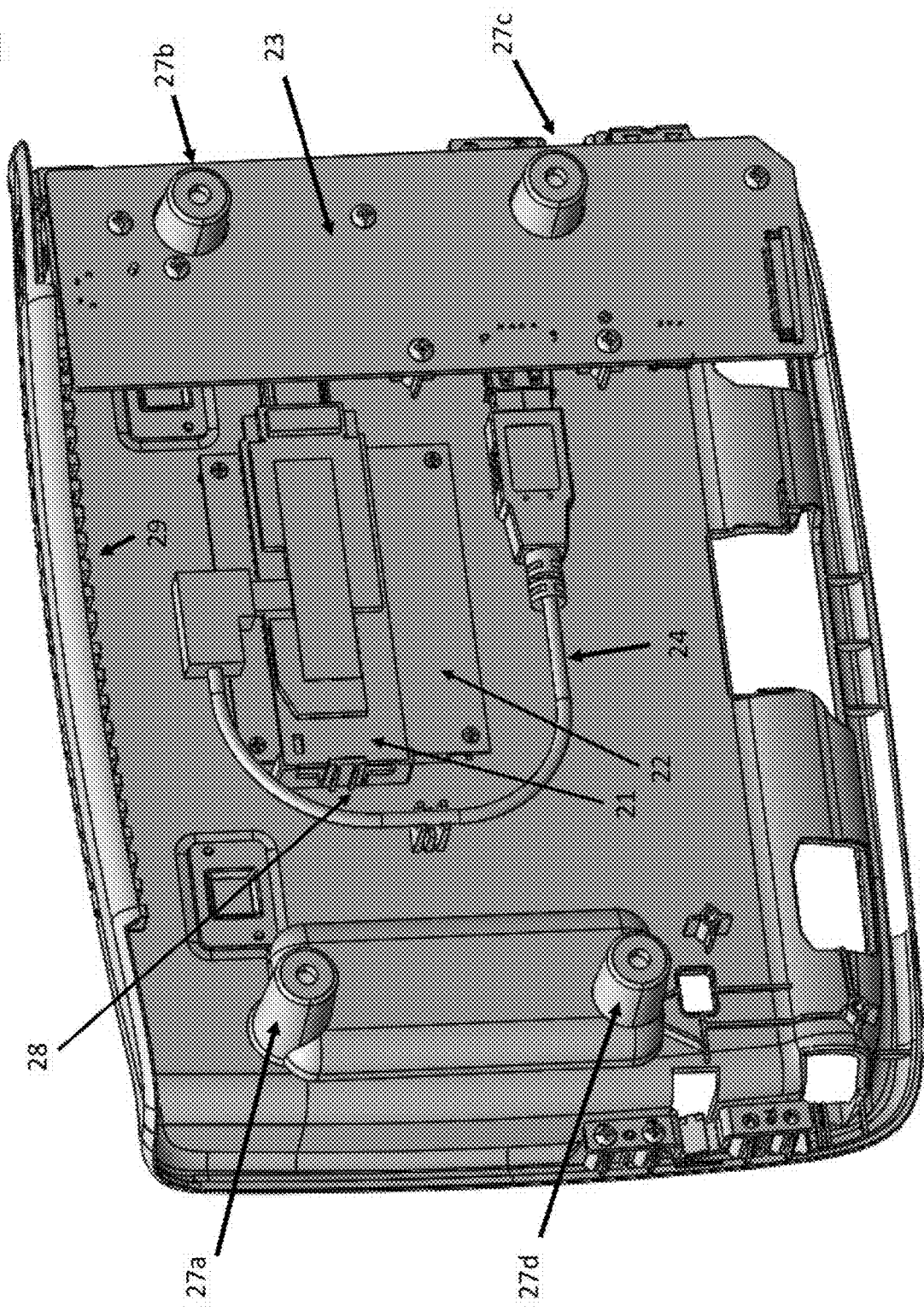
FIG. 2C illustrates a second perspective view of a back side of a monitor assembly for a vehicle headrest according to an exemplary embodiment of the present invention.

FIGS. 2A and 2C illustrate first and second perspective views of a back side of a monitor assembly for a vehicle headrest according to an exemplary embodiment of the present invention. FIG. 2B illustrates a direct view of a back side of a monitor assembly for a vehicle headrest according to an exemplary embodiment of the present invention. In particular, FIGS. 2A-2C show the back side of the monitor holding part 30.

As shown in FIGS. 2A-2C, the back side of the monitor holding part 30 includes a digital media player 21, a heat sink 22 and an input/output board 23. The digital media player 21 may be Amazon Fire TV stick; however, the present invention is not limited thereto and the digital media player 21 may be any other streaming stick such as a Roku streaming stick. The heat sink 22 may square in shape and may be disposed under the digital media player 21. The heat sink 22 may be made of aluminum, for example. The input/output board 23 may be a printed circuit board (PCB) that includes various input/output components such as USB, HDMI, audio line out, etc. The input/output board 23 is connected to the digital media player 21 via a wire 24 to supply power to the digital media player 21. The wire 24 is connected to a USB port of the input/output board 23 and a micro-USB port of the digital media player 21. The input/output board 23 is additionally connected to the digital media player 21 via an HDMI connector and port 25/26.

As further shown in FIGS. 2A-2C, the back side of the monitor holding part 30 includes four posts 27a-27d for positioning against the back side of a vehicle headrest. In addition, the back side of the monitor holding part 30 may include a thermal pad between the digital media player 21 and the heat sink 22. The back side of the monitor holding part 30 may also include a clip 28 for securing the digital media player 21 in place over the heat sink 22. It is to be understood, however, that the clip 28 can be reconfigured to secure other types of digital media players. For example, in place of the clip 28 rubber adaptors may be used to secure the digital media player 21 in place. The electronic components of the back side of the monitor holding part 30 may be covered in whole or in part by a plastic cover.

FIGS. 2A-2C further show a vent 29. In reference to FIGS. 1A and 1B as well, it can be seen that the vent 29 includes holes to permit heat to escape from the monitor assembly 10. The holes of the vent 29 are exposed at the back side of the monitor holding part 30 as well as the front side of the monitor holding part 30. The vent 29 extends lengthwise near an edge of the back side of the monitor holding part 30. As can be further seen in reference to FIGS. 1A-2C, the vent 29 is formed in a lip protruding from the back side of the monitor holding part 30. The lip may be is substantially perpendicular to the back side of the monitor holding part 30. The holes of the vent 29 may overlap the digital media player 21 in a direction parallel to a surface of the back side of the monitor holding part 30.

Figure 3B:
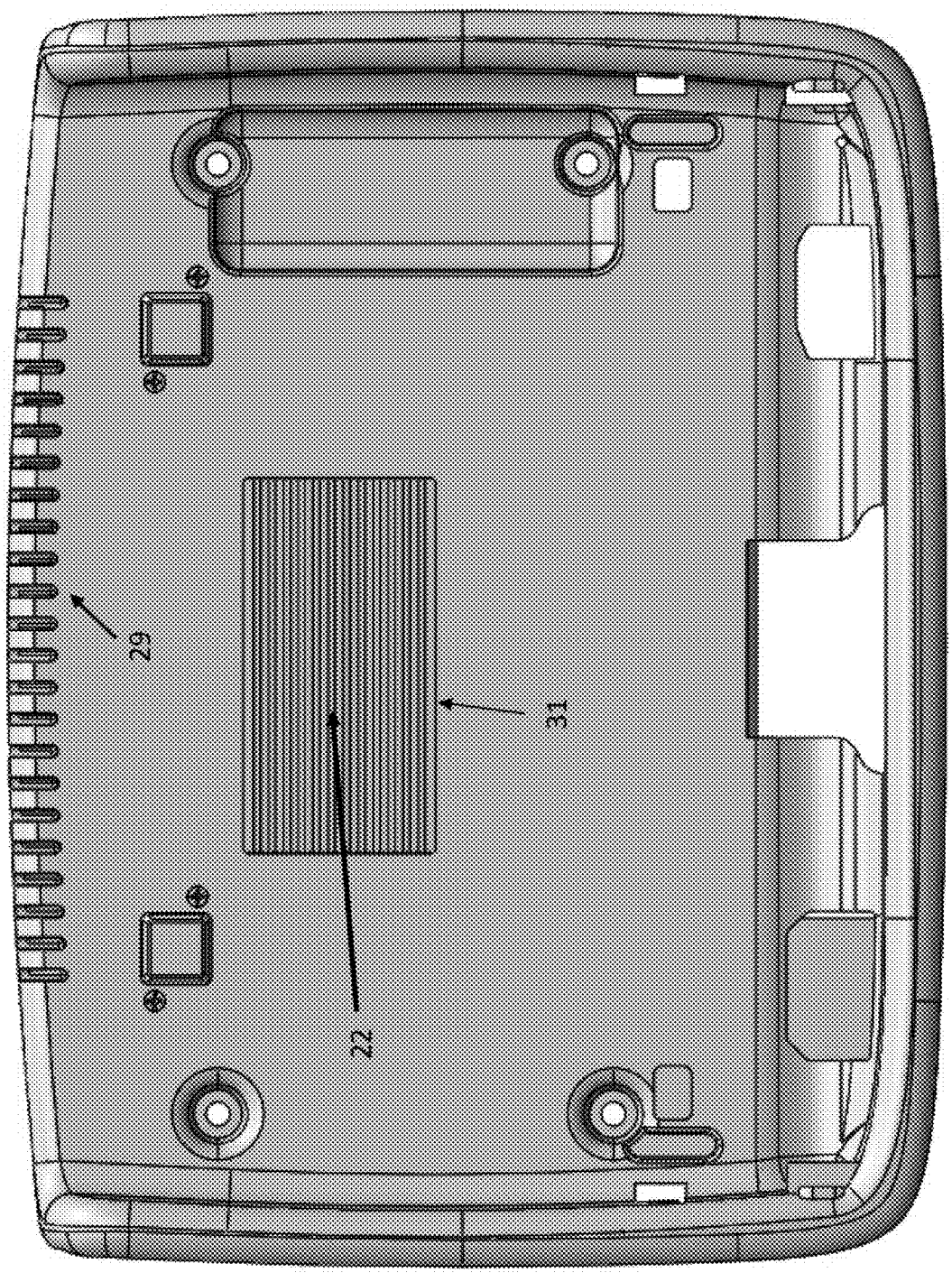
FIG. 3B illustrates a direct view of a monitor facing side of a monitor assembly for a vehicle headrest according to an exemplary embodiment of the present invention.
Figure 3C:
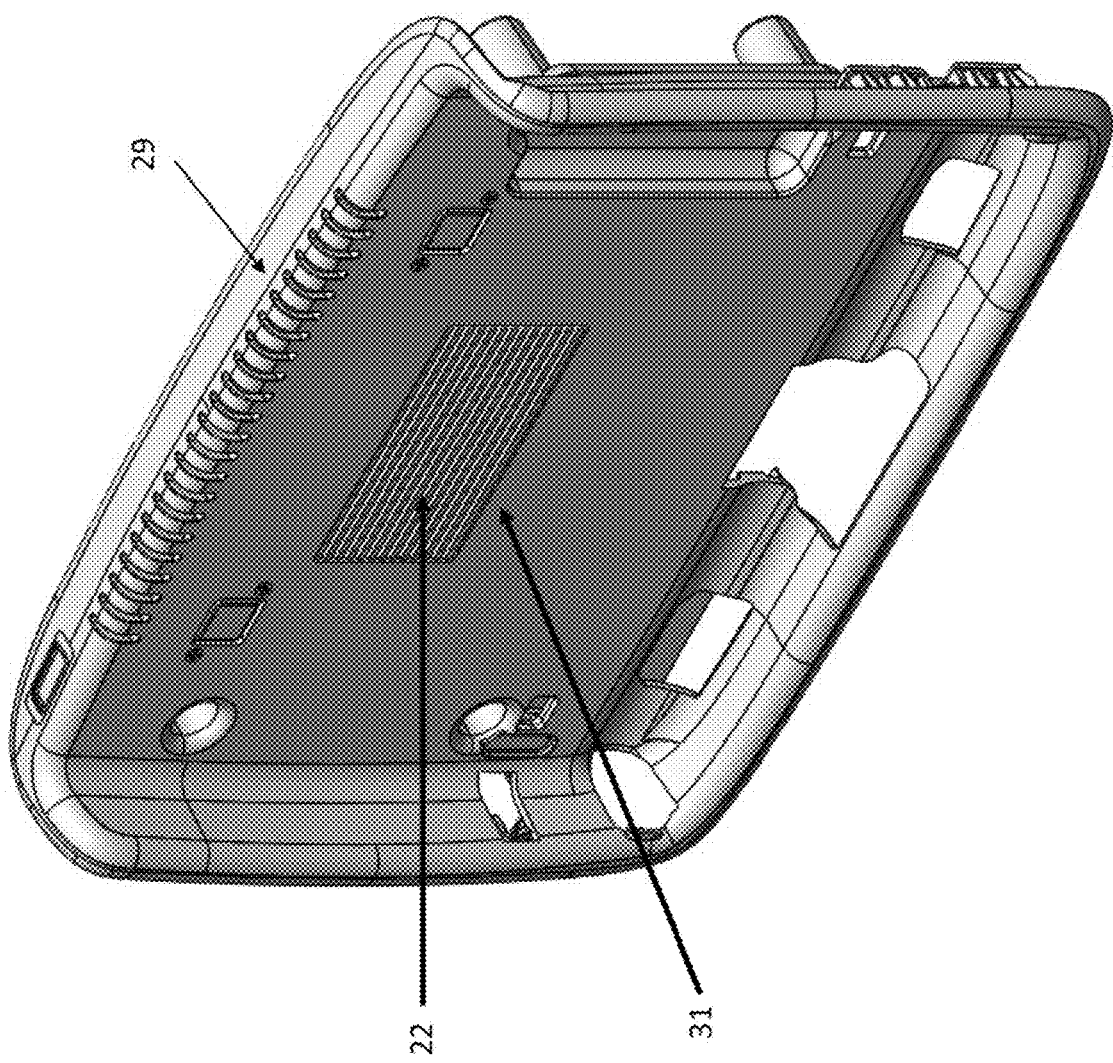
FIG. 3C illustrates a second perspective view of a monitor facing side of a monitor assembly for a vehicle headrest according to an exemplary embodiment of the present invention.

FIGS. 3A and 3C illustrate first and second perspective views of a monitor facing side of a monitor assembly for a vehicle headrest according to an exemplary embodiment of the present invention. FIG. 3B illustrates a direct view of a monitor facing side of a monitor assembly for a vehicle headrest according to an exemplary embodiment of the present invention. In particular, FIGS. 3A-3C show the front side of the monitor holding part 30.

As shown in FIGS. 3A-3C, the front side of monitor holding part 30 includes an opening 31 through which the heat sink 22 is exposed. The opening 31 may have a square shape, but is not limited thereto. The exposed portion of the heat sink 22 includes parallel lines. FIGS. 3A-3C further show the vent 29 and its position at the upper portion of the front side of the monitor holding part 30. The monitor holding part 30 is configured such that it can encase the monitor 20 with three sides at the front thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A monitor assembly for a vehicle headrest, comprising:
a monitor;
a monitor holding part, the monitor holding part including a first side and a second side opposite the first side, the first side configured to connect the monitor thereto, the second side configured to face a vehicle headrest, the monitor holding part having an opening therein;
a heat sink comprising a thermally conductive body on the second side of the monitor holding part adjacent the opening and exposed to the first side of the monitor holding part through the opening;
a digital media player disposed on the heat sink;
an input/output board disposed on the second side of the monitor holding part and connected to the digital media player; and
a vent extending lengthwise adjacent to an edge of the second side of the monitor holding part.

2. The monitor assembly of claim 1, wherein the digital media player is an Amazon Fire TV stick or a Roku streaming stick.

3. The monitor assembly of claim 1, wherein the vent is exposed at the first side of the monitor holding part.

4. The monitor assembly of claim 1, comprising a thermal pad between the digital media player and the heat sink.

5. The monitor assembly of claim 1, further comprising a clip for securing a first side of the digital media player, the first side of the digital media player being opposite a second side of the digital media player, the second side of the digital media player including a connector for mating with the input/output board.

6. The monitor assembly of claim 1, further comprising an adaptor for securing a first side of the digital media player, the first side of the digital media player being opposite a second side of the digital media player, the second side of the digital media player including a connector for mating with the input/output board.

7. The monitor assembly of claim 1, wherein the digital media player is provided with power via the input/output board.

8. The monitor assembly of claim 1, wherein the monitor assembly is configured to be disposed in a recess at a rear side of a vehicle headrest.

9. The monitor assembly of claim 1, wherein the heat sink faces a back side of the monitor.

10. A monitor assembly for a vehicle headrest, comprising:
 a monitor;
 a monitor holding part including a first side mounting the monitor and a second side opposite the first side, the monitor holding part having an opening therein;
 a heat sink comprising a thermally conductive body on the second side of the monitor holding part adjacent the opening and exposed to the first side of the monitor holding part through the opening;
 a wireless streaming stick mounted on the heat sink and configured to provide digital media streaming from a wireless network to the monitor; and
 an input/output board on the second side of the monitor holding part and connected to the wireless streaming stick.

11. The monitor assembly of claim 10, wherein the wireless streaming stick comprises an Amazon Fire TV stick or a Roku streaming stick.

12. The monitor assembly of claim 10, further comprising a clip for securing a first side of the digital media player, and the first side of the wireless streaming stick being opposite a second side of the wireless streaming stick, the second side of the wireless streaming stick including a connector for mating with the input/output board.

13. The monitor assembly of claim 10, further comprising an adaptor for securing a first side of the wireless streaming stick, the first side of the wireless streaming stick being opposite a second side of the wireless streaming stick, the second side of the wireless streaming stick including a connector for mating with the input/output board.

14. The monitor assembly of claim 10, wherein the wireless streaming stick is provided with power via the input/output board.

15. The monitor assembly of claim 10, wherein the monitor assembly is configured to be disposed in a recess at a rear side of a vehicle headrest.

16. The monitor assembly of claim 10, wherein the heat sink faces a back side of the monitor.

\* \* \* \* \*